United States Patent [19]
Sywyk

[11] Patent Number: 5,765,214
[45] Date of Patent: Jun. 9, 1998

[54] MEMORY ACCESS METHOD AND APPARATUS AND MULTI-PLANE MEMORY DEVICE WITH PREFETCH

[75] Inventor: Stefan P. Sywyk, San Jose, Calif.

[73] Assignee: Cypress Semiconductor Corporation, San Jose, Calif.

[21] Appl. No.: 635,551

[22] Filed: Apr. 22, 1996

[51] Int. Cl.⁶ ..................................................... G06F 12/00
[52] U.S. Cl. ................ 711/213; 395/383; 365/203; 365/182.25; 364/DIG. 1
[58] Field of Search ..................... 365/189.01, 203, 365/210, 227; 395/416, 446; 711/213

[56] References Cited

U.S. PATENT DOCUMENTS

| | | | |
|---|---|---|---|
| 5,062,079 | 10/1991 | Tsuchida et al. | 365/210 |
| 5,327,386 | 7/1994 | Fudeyasu | 365/221 |
| 5,461,718 | 10/1995 | Tatosian et al. | 395/416 |
| 5,508,960 | 4/1996 | Pinkham | 365/189.01 |
| 5,544,342 | 8/1996 | Dean | 395/446 |
| 5,631,871 | 5/1997 | Park et al. | 365/203 |

*Primary Examiner*—Tod R. Swann
*Assistant Examiner*—David Langjahr
*Attorney, Agent, or Firm*—Oblon, Spivak, McClelland, Maier & Neustadt, P.C.

[57] ABSTRACT

A method is described for accessing data in a memory that has a first memory plane and a second memory plane. The method includes the step of sending a first plurality of data from the first memory plane to a data port. A second plurality of data from the second memory plane is pre-fetched only while the first plurality of data is sent from the first memory plane. The pre-fetching is performed a first plurality of clock cycles before the second plurality of data is sent to the data port.

25 Claims, 4 Drawing Sheets

MEMORY ACCESS METHOD AND APPARATUS AND MULTI-PLANE MEMORY DEVICE WITH PREFETCH

FIELD OF THE INVENTION

The present invention pertains to the field of computer memories. More specifically, the present invention relates to pre-fetch circuitry in memories for read operations.

BACKGROUND OF THE INVENTION

Figure 1:
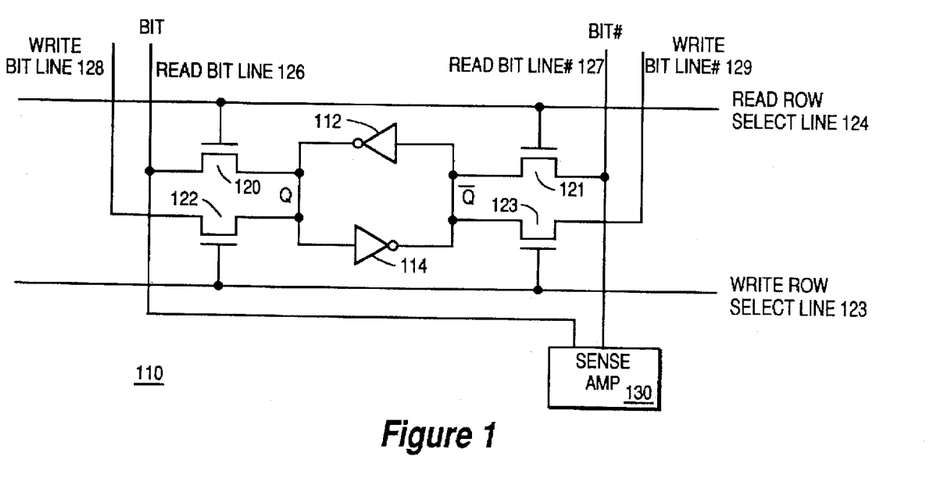
FIG. 1 illustrates a dual ported differential memory cell coupled to a differential sense amplifier.

Static memories, whether implemented as stand alone memory units or used in a processor register file or cache, typically comprise an array of memory cells arranged in rows and columns. FIG. 1 illustrates a portion of one such memory unit, a First In First Out (FIFO) memory implementing a dual ported differential memory cell. The differential memory cell 110 contains metal-oxide semiconductor field-effect transistors (MOSFETs) 120, 121, 122, and 123 and inverters 112 and 114. Inverter 112 is cross-coupled to inverter 114. Together, inverters 112 and 114 form a storage flip-flop capable of holding one bit of information. Differential memory cell 110 comprises two pairs of conductors 126, 127, 128, and 129 called bit lines. Memory cell 110 is written to by driving write bit line 128 to a first state and write bit line complement 129 to a second, opposite state and applying an input voltage to write row select line or word line 123. The application of the input voltage couples inverters 112 and 114 with bit lines 128 and 129 and allows bit lines 128 and 129 to program memory cell 110. The content of the memory cell 110 is read by applying an input voltage to read row-select line or word line 124 coupled to the read bit lines 126 and 127 and sensing which bit line experiences a change in voltage. The application of the input voltage couples inverters 112 and 114 with bit lines 126 and 127 and Q appears on bit line 126. Bit lines 126 and 127 act as capacitors which may be precharged to a predetermined voltage prior to reading the memory location. The state assumed by a selected memory cell 110 determines which bit line, the true bit line 126 or the complement bit line 127, will be discharged toward ground when the cell is read.

Sense amplifier 130 is coupled to bit lines 126 and 127 and senses the state of the selected bit lines. Sense amplifier 130 is a differential sense amplifier and amplifies the voltage difference between the true 126 and complement bit lines 127. If the difference between the bit lines 126 and 127 is a positive value, sense amplifier 130 indicates that the memory cell 110 is programmed to a first logical state. If the difference between the bit line voltages is a negative value, the sense amplifier 130 indicates that the memory cell 110 is programmed to a second logical state, opposite of the first logical state.

Figure 2:
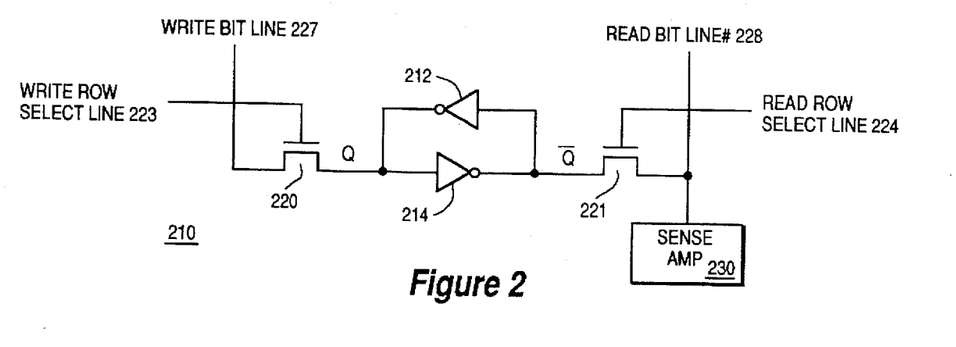
FIG. 2 illustrates a dual ported single ended memory cell coupled to a single ended sense amplifier.

FIG. 2 illustrates a portion of a second type of memory unit, a FIFO memory implementing a dual ported single ended memory cell. Single ended memory cell 210 contains metal-oxide semiconductor field-effect transistors (MOSFETs) 220 and 221 and inverters 212 and 214. Inverter 212 is cross-coupled to inverter 214. Together, inverters 212 and 214 form a storage flip-flop capable of holding one bit of information. Single ended memory cell 210 comprises a pair of conductors or bit lines 227 and 228. Memory cell 210 is written to by driving write bit line 227 to either a first or second (opposite) state and applying an input voltage to write row-select line or word line 223. The input voltage couples inverters 212 and 214 to bit line 227 allowing bit line 227 to program memory cell 210. The content of the memory cell 210 is read by applying an input voltage to a selected read word line or row-select line 224 coupled to the read bit line compliment 228 and sensing whether there is a change in voltage on the bit line 228. The application of the input voltage couples inverter 214 with bit line 228 and $\overline{Q}$ appears on bit line 228. Bit line 228 acts as a capacitor and may be precharged to a predetermined voltage prior to reading the memory location.

The state assumed by memory cell 210 determines whether there is a change in voltage when the cell 210 is read. Sense amplifier 230 is coupled to the read bit line compliment 228 and senses the state of bit line 228.

The rate at which sense amplifiers sense the state to which a memory cell is programmed is critical to the access time of the memory. Often times, the designation of longer memory read cycles is required to allow sense amplifiers to process slow discharging bit lines in a memory.

In the past, memory arrays were segmented in order to reduce the number of memory cells on a bit line. This reduced the discharging time required from the bit line to generate accurate results for the sense amplifier to process. However, the segmentation of the memory array required additional column selection circuitry. The additional column selection circuitry to support the segmented memory array occupied valuable die space and resulted in additional production costs. With increased performance requirements of computer systems, memory units implementing differential memory cells and single ended memory cells with enhanced performance are required.

Thus, what is needed is an improved memory unit with a fast access time regardless of whether a differential or a single ended memory cell is used.

SUMMARY OF THE INVENTION

One of the features of the present invention is to allow a memory to have an access time that is as fast as that of a memory employing a differential memory cell.

Another feature of the invention is to provide a memory where a single ended memory cell can drive a large high capacitance bit line.

A further feature of the invention is to provide a memory which exploits the known order of reading data from a FIFO memory to achieve high speed.

A still further feature of the invention is to provide a memory having two memory planes where data is made available from a first memory plane at one time while data is being pre-fetched from the second memory plane well in advance of when it is needed by the user.

A method for accessing data in a memory having a first memory plane and a second memory plane is described. The method includes the steps of pre-fetching a first plurality of data from the first memory plane. A second plurality of data from the second memory plane is sent to a data bus only during the time the first plurality of data from the first memory plane is pre-fetched.

A memory is described that includes a data port which is for coupling to an external data bus. A first memory plane is coupled to the data bus. A second memory plane is coupled to the data bus. A pre-fetching circuit is coupled to the first memory plane. The pre-fetching circuit pre-fetches a first plurality of data from the first memory plane. A data retrieving circuit is coupled to the second memory plane. The data retrieving circuit sends a second plurality of data from the second memory plane to the data bus only while the pre-fetching circuit is pre-fetching the first plurality of data. Similarly, a third plurality of data is pre-fetched from the second memory plane while the first plurality of data is sent to the data bus.

An apparatus is described which accesses data from a memory having a first memory plane and a second memory plane. The apparatus comprises a counter which generates an address of a memory cell to be accessed. The address is of a memory cell residing in either the first memory plane or the second memory plane. Logic circuitry is coupled to the counter. The logic circuitry outputs a first signal when the address of the memory cell is in the first memory plane and outputs a second signal when the address of the memory cell is in the second memory plane. Pre-fetching circuitry is coupled to the logic circuitry. The pre-fetching circuitry pre-fetches data from the second memory plane when receiving the first signal and pre-fetches data from the first memory plane when receiving the second signal.

The pre-fetching of the data is done substantially in advance. This allows a single-ended memory cell using a low performance sense amplifier to drive a large bit line capacitance without sacrificing performance.

BRIEF DESCRIPTION OF THE DRAWINGS

The present invention is illustrated by way of example and not by way of limitation in the figures of the accompanying drawings, in which like references indicate similar elements and in which.

DETAILED DESCRIPTION

A method and apparatus for accessing data in a memory is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Figure 3:
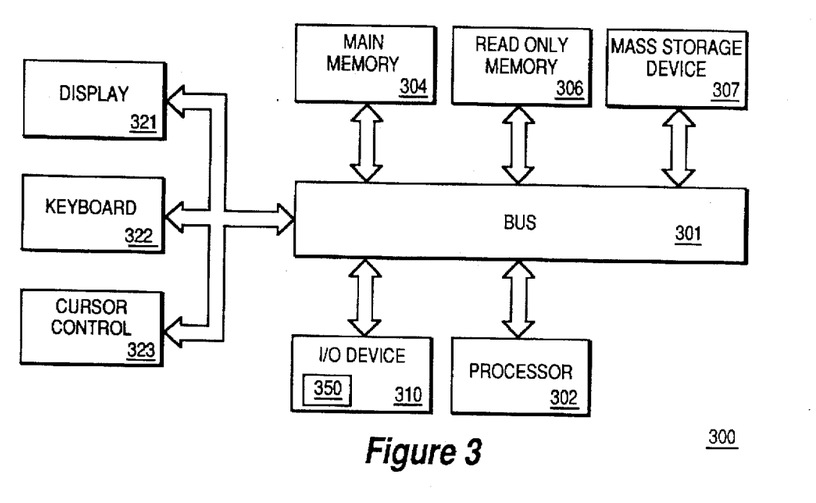
FIG. 3 illustrates the present invention as implemented in a computer system.

Referring to FIG. 3, the computer system upon which the preferred embodiment of the present invention can be implemented is shown as 300. Computer system 300 comprises a bus or other communication means 301 for communicating information, and a processing means 302 coupled with bus 301 for processing information. System 300 further comprises a random access memory (RAM) or other dynamic storage device 304 (referred to as main memory), coupled to bus 301 for storing information and instructions to be executed by processor 302. Main memory 304 also may be used for storing temporary variables or other intermediate information during execution of instructions by processor 302. Computer system 300 also comprises a read only memory (ROM) and/or other static storage device 306 coupled to bus 301 for storing static information and instructions for processor 302. Data storage device 307 is coupled to bus 301 for storing information and instructions.

A data storage device 307 such as a magnetic disk or optical disk and its corresponding disk drive can be coupled to computer system 300. Computer system 300 can also be coupled via bus 301 to a display device 321, such as a cathode ray tube (CRT), for displaying information to a computer user. An alphanumeric input device 322, including alphanumeric and other keys, is typically coupled to bus 301 for communicating information and command selections to processor 302. Another type of user input device is cursor control 323, such as a mouse, a trackball, or cursor direction keys for communicating direction information and command selections to processor 302 and for controlling cursor movement on display 321. This input device typically has two degrees of freedom in two axes, a first axis (e.g., x) and a second axis (e.g., y), which allows the device to specify positions in a plane.

Alternatively, other input devices such as a stylus or pen can be used to interact with the display. A displayed object on a computer screen can be selected by using a stylus or pen to touch the displayed object. The computer detects the selection by implementing a touch sensitive screen. Similarly, a light pen and a light sensitive screen can be used for selecting a displayed object. Such devices may thus detect selection position and the selection as a single operation instead of the "point and click," as in a system incorporating a mouse or trackball. Stylus and pen based input devices as well as touch and light sensitive screens are well known in the art. Such a system may also lack a keyboard such as 322 wherein all interface is provided via the stylus as a writing instrument (like a pen) and the written text is interpreted using optical character recognition (OCR) techniques.

Input/output (I/O) device 310 is coupled to bus 301. I/O device 310 may be, for example, a printer or an interface used for data communication between computer system 300 and another computer system (not pictured). Memory unit 350 resides in I/O device 310. In one embodiment of the present invention, memory unit 350 buffers data sent from processor 302 at a first rate. Memory unit 350 allows I/O device 310 to process the buffered data sent from processor 302 at its own rate without requiring processor 302 to send data at the operating rate of I/O device 310. In another embodiment of the present invention, memory unit 350 buffers data sent from another computer system to computer system 300. Memory unit 350 allows computer system 300 to process the buffered data sent from the other computer system without requiring the other computer system to send data at the operating rate of computer system 300. Memory unit 350 operates as a first in first out (FIFO) memory which outputs data read from the memory in the same order as the data was written into the memory.

Figure 4:
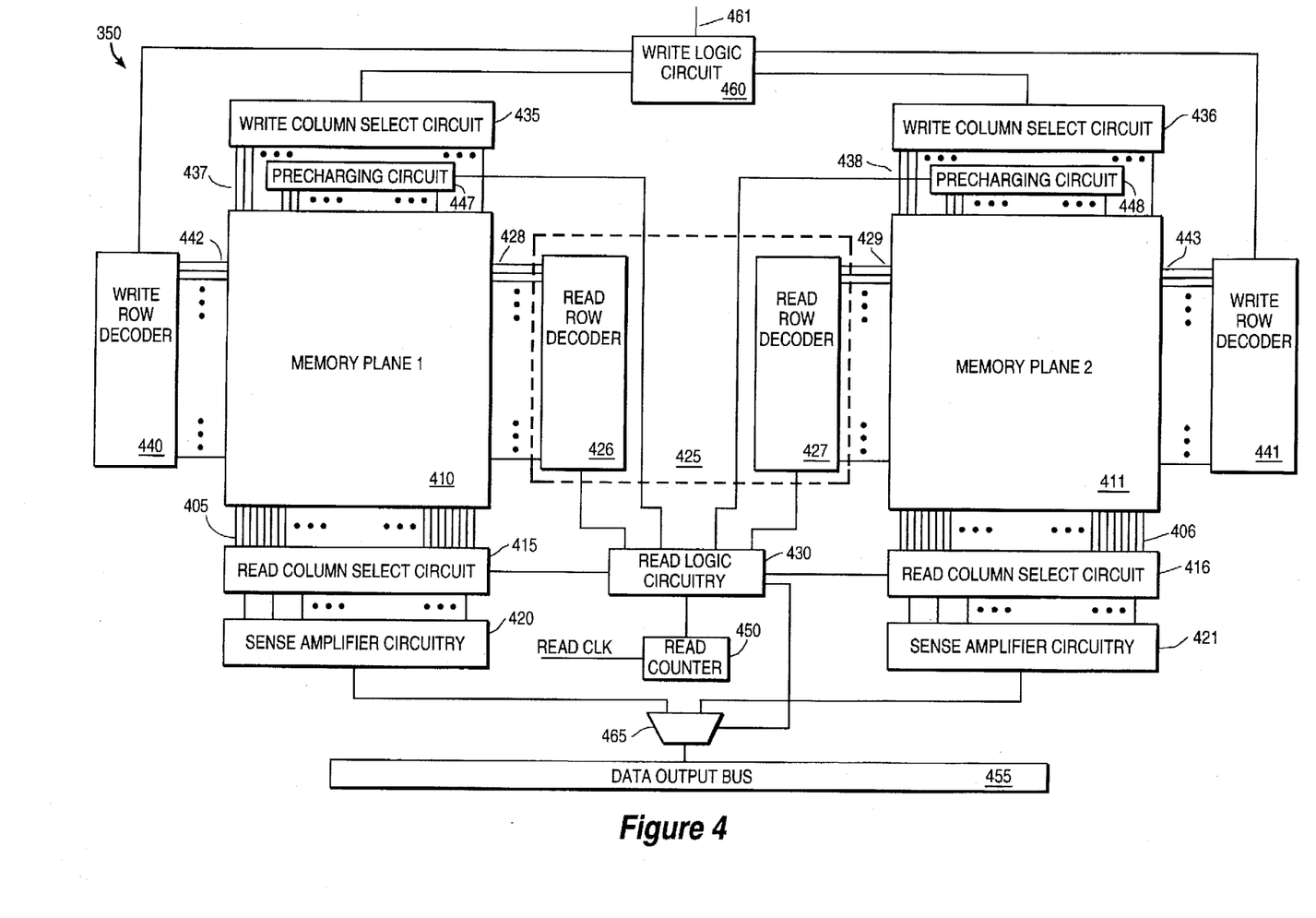
FIG. 4 illustrates a block diagram of one embodiment of the present invention.

FIG. 4 illustrates a block diagram of a memory unit according to one embodiment of the present invention. Memory unit 350 comprises a first memory plane 410 and a second memory plane 411. First and second memory planes 410 and 411 comprise a plurality of memory cells configured in a plurality of rows and columns. The memory cells may be single ended dual ported memory cells or differential dual ported memory cells. In a preferred embodiment of the present invention, the first memory plane 410 and the second memory plane 411 each comprises 155, 520 memory cells configured in 540 rows and 288 columns.

Write column select circuit 435 and write row decoder 440 are coupled to the first memory plane 410. Write column select circuit 435 and write row decoder 440 operate to program the contents of memory cells in the first memory plane 410. Write row decoder 440 applies an input voltage on one of a plurality of write row-select lines 442 which accesses a row of memory cells in the first memory plane 410. The input voltage couples each of the memory cells in that row to a corresponding write bit line 437. Write column select circuit 435 drives each of the column selected write bit lines 437 to either a first or second state. The state of a bit line programs the content of its corresponding memory cell. Write column select circuit 435 and write row decoder 440 may be implemented by any known circuitry. Similarly, write column select circuit 436 and write row decoder 441 are coupled to the second memory plane 411. Write column select circuit 436 and write row decoder 441 operate to program the contents of memory cells in the second memory plane 411. Write row decoder 441 applies an input voltage on one of a plurality of write row-select lines 443 which accesses a row of memory cells in the second memory plane 411. The input voltage couples each of the memory cells in that row to a corresponding write bit line 438. Write column select circuit 436 drives each of the column selected write bit lines 438 to either a first or second state. The state of a bit line programs the content of its corresponding memory cell. Write column select circuit 436 and write row decoder 441 may be implemented by any known circuitry.

Write logic circuit 460 is coupled to write column select circuits 435 and 436 and write row decoders 440 and 441. Write logic circuit 460 operates to coordinate the location at which data is written into memory unit 350. Logic circuit 460 receives the data to be written into memory unit 350 from input line 461 and assigns an address in either the first memory plane 410 or the second memory plane 411 to the data. In a preferred embodiment of the present invention, logic circuit 460 alternates between assigning consecutive addresses in a row in the first memory plane 410 and consecutive addresses in a row in the second memory plane 411. Thus, for example, when 64 words are to be written into memory unit 350, logic circuit 460 assigns words 1–16 to be written across a first row of memory cells in the first memory plane 410, words 17–32 across the same first row, but in the second memory plane 411, words 33–48 across a second row of memory cells in the first memory plane 410 and words 49–64 across the same row, but in the second memory plane 411. Thus, when worlds 1–64 are read from memory unit 350, first memory plane 410 and second memory plane 411 would be accessed in alternate stages. Logic circuitry 460 may be implemented by any known circuitry. In one embodiment of the present invention, write row decoders 440 and 441 are shift registers.

Precharging circuitry 447 is coupled to first memory plane 410. Precharging circuitry 447 operates to precharge the read bit lines in first memory plane 410. Precharging circuitry 448 is coupled to second memory plane 411. Precharging circuitry 448 operates to precharge the read bit lines in second memory plane 411. Precharging circuitry 447 and 448 may be implemented by any known circuitry.

Row decoder circuitry 425 is coupled to the first and second memory planes 410 and 411. Row decoder circuitry 425 comprises read row decoder 426 and read row decoder 427. Read row decoder 426 applies an input voltage on one of a plurality of read row-select lines 428 which accesses a row of memory cells in the first memory plane 410. The input voltage couples each of the memory cells in the selected row to a corresponding read bit line. Each of the memory cells in the selected row discharges its corresponding read bit line according to the state of the memory cell. Similarly, read row decoder 427 is coupled to the second memory plane 411. Read row decoder 427 applies an input voltage on one of a plurality of read row-select lines 429 which accesses a row of memory cells in the second memory plane 411. The input voltage couples each of the memory cells in the selected row to a corresponding read bit line. Each of the memory cells in the selected row discharges its corresponding read bit line according to the state of the memory cell. Precharging circuits 447 and 448 and read row decoders 426 and 427 operate as pre-fetching circuitry. Pre-fetching involves precharging and discharging read bit lines corresponding to memory cells which will be read many read cycles before the data in the cells are to be sent to a data bus. Read row decoders 426 and 427 may be implemented by any known circuitry. In one embodiment of the present invention, read row decoders 426 and 427 are shift registers.

Read column select circuit 415 is coupled to the read bit lines 405 in the first memory plane 410 and sense amplifier circuitry 420. Read column select circuit 415 operates to sequentially pass the signals on the read bit lines to sense amplifier circuitry 420. Sense amplifier circuitry 420 processes the read bit line signals and determines whether a read bit line was driven to a first state or a second state. Similarly, read column select circuit 416 is coupled to the read bit lines 406 in the second memory plane 411 and sense amplifier circuitry 421. Read column select circuit 416 operates to sequentially pass the signals on the read bit lines to sense amplifier circuitry 421. Sense amplifier circuitry 421 processes the read bit line signals and determines whether a read bit line was driven to a first state or a second state. Multiplexer 465 receives outputs from sense amplifier circuitry 420 and 421 and selects which output to send onto external data bus 455. Data bus 455 is coupled to multiplexer 465 via a data port. The data port resides on the same semiconductor substrate as multiplexer 465 and sense amplifier circuitry 420 and 421. Read column select circuits 415 and 416, sense amplifier circuitry 420 and 421, and multiplexer 465 operate as data retrieving circuitry. Data retrieving circuitry operates to retrieve memory cell data on read bit lines and send the data onto a data bus. Read column select circuits 415 and 416, sense amplifier circuitry 420 and 421, and multiplexer 465 may be implemented by any known circuitry.

Read counter 450 receives a signal from a read clock during a read cycle indicating that data from a next memory cell is to be read. Upon receiving a signal, counter 450 generates an address of a memory cell in memory unit 350 at which data is to be read. Because memory unit 350 operates as a first in first out memory, data is stored in first memory plane 410 and second memory plane 411 in a known order. Read counter 450 generates sequential address values corresponding to the sequential order at which data was written into memory unit 350.

Read logic circuitry 430 is coupled to counter 450 and receives an address generated by counter 450. Because data is written into memory unit 350 and read out of memory unit 350 at a known order, when given a current address of a memory cell to be read, logic circuitry 430 is able to determine which memory cells will be read in future read cycles. Logic circuit 430 is coupled to precharging circuit 447, read row decoder 426, and read column select circuit 415. Logic circuit 430 operates to coordinate the precharging and discharging of read bit lines corresponding to memory cells which will be read in future read cycles. Logic circuit 430 also operates to coordinate the retrieval of memory cell data on read bit lines and the sending of the memory cell data to a data bus. When a plurality of data is to be read from second memory plane 411, logic circuit 430 instructs precharging circuitry 447 to precharge the read bit lines 405 corresponding to memory cells in first memory plane 410 which will be read in future read cycles. After the read bit lines 405 have been precharged, logic circuit 430 instructs read row decoder 426 to discharge the read bit lines according to the data stored in their corresponding memory cells. The precharging and discharging is performed while read column select circuit 416 is retrieving data from second memory plane 411.

Logic circuit 430 is also coupled to precharging circuit 448, read row decoder 427, and read column select circuit 416. Read logic circuit 430 operates to coordinate the precharging and discharging of read bit lines corresponding to memory cells which will be read in future read cycles. Logic circuit 430 also operates to coordinate the retrieval of memory cell data on discharged read bit lines and the sending of the memory cell data to a data bus. When a plurality of data is to be read from first memory plane 410, logic circuit 430 instructs precharging circuitry 448 to precharge the read bit lines 406 corresponding to memory cells in second memory plane 411 which will be read in future read cycles. After the read bit lines 406 have been precharged, logic circuit 430 instructs read row decoder 427 to discharge the read bit lines according to the data stored in their corresponding memory cells. The precharging and discharging is performed while read column select circuitry 415 is retrieving data from read bit lines in first memory plane 410. In one embodiment of the present invention, first memory plane 410, second memory plane 411, row decoder circuitry 425, precharging circuits 447 and 448, read column select circuits 415 and 416, sense amplifier circuitry 420 and 421, logic circuitry 430, counter 450, multiplexer 465, write row decoders 440 and 421, and logic circuit 460, and the data port all reside on the same semiconductor substrate.

By coordinating the precharging and discharging of read bit lines corresponding to memory cells in a memory plane many read cycles before they are to appear on the data bus 455, read logic circuit 430 reduces the time required for making the data in the memory cells of the memory plane available when the data is later requested. In one embodiment of the present invention, data is pre-fetched 4 read cycles before the data is sent to data bus 455. In an alternate embodiment of the present invention, data is pre-fetched 8 read cycles before data is sent to data bus 455. The architecture of memory unit 350 allows data to be pre-fetched up to 16 read cycles before data is sent to data bus 455.

Pre-fetching the data achieves the result of making the access time of reading data in memory planes very short to the user. Pre-fetching of future data is possible since the order of which data is to be read from memory unit 350 is known. Writing blocks of data alternately in two different memory planes allows the pre-fetch circuitry of memory unit 350 to precharge and discharge read bit lines in one plane while retrieving data in the other plane.

The reduction of time required to access data from first and second memory planes 410 and 411 by pre-fetching allows systems to use slower memory cells without sacrificing speed. Slower memory cells such as single ended memory cells can be used to drive a large high capacitance bit line and be sensed by a simple inverter for a sense amplifier that is non-differential. The use of slower memory cells such as single ended memory cells along with simple low power sense amplifiers allows the semiconductor memory to be smaller and lower power than conventional differential memories. This, in turn, allows computer systems to save power and space.

In one embodiment of the present invention, an entire row of memory cells are pre-fetched 16 clock cycles before the row is accessed to be read. In this embodiment, as a first address in a row of one memory plane is generated by read counter 450, read logic circuitry 430 activates the precharging circuitry of an alternate memory plane resulting in the precharging of the read bit lines in the alternate memory plane. After a predetermined number of memory cells have been read and a predetermined number of clock cycles have transpired, logic circuitry 430 deactivates the precharging circuitry of the alternate memory plane and activates the read row decoder circuit corresponding to the alternate memory plane. The read row decoder circuit couples the precharged read bit lines with a row of memory cells in the alternate memory plane to be read next. This results in the read bit lines being discharged according to their corresponding memory cells. In one embodiment of the present invention, read bit lines corresponding to memory cells to be read in the alternate memory plane are precharged for four clock cycles. In another embodiment of the present invention, read bit lines corresponding to memory cells to be read in the alternate memory plane are discharged twelve clock cycles before the first memory cell in their row is to be selected by the corresponding read column selector.

Figure 5:
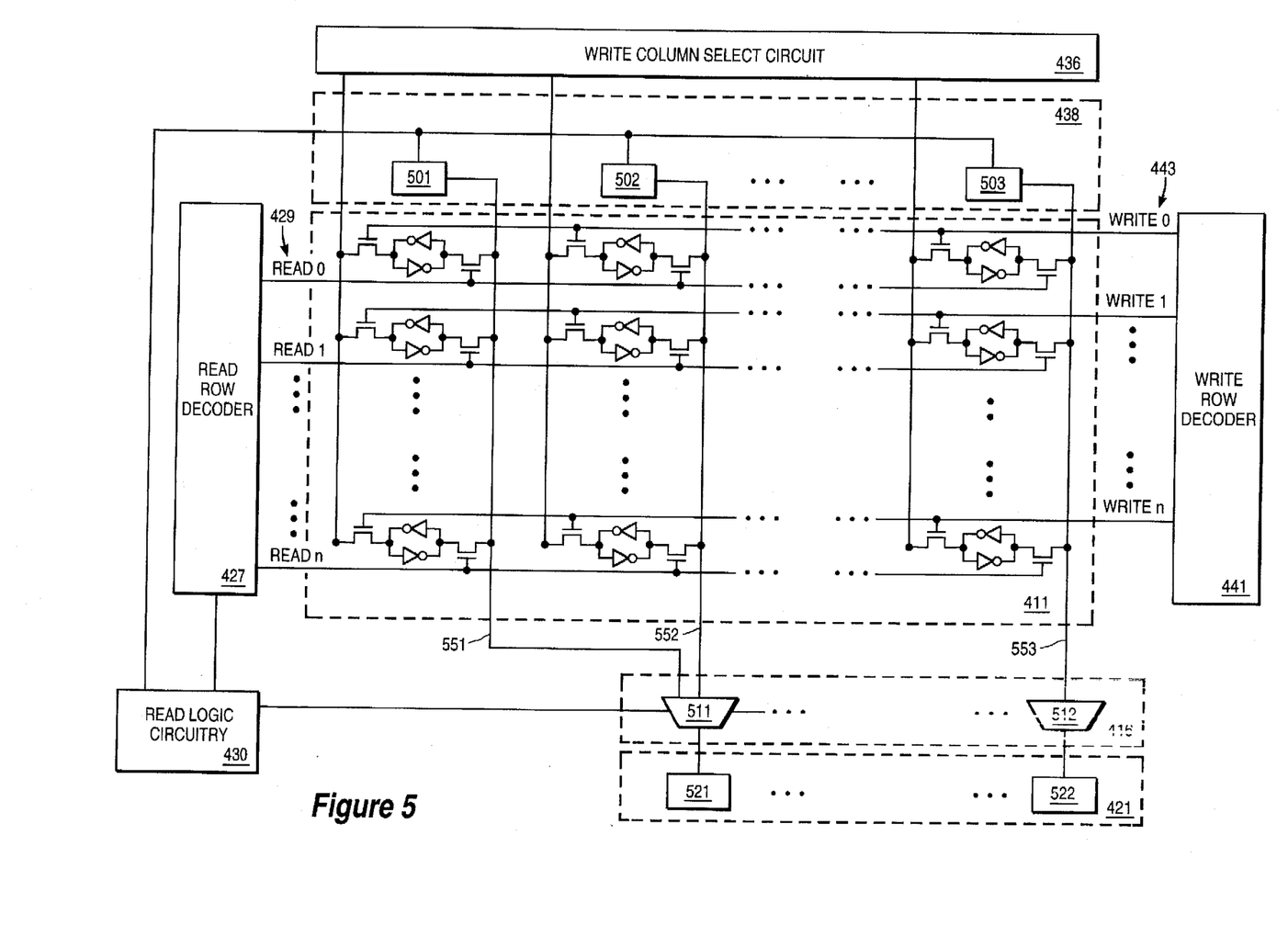
FIG. 5 illustrates the present invention in a memory utilizing dual ported single ended memory cells.

FIG. 5 illustrates an embodiment of the present invention in a memory utilizing single ended memory cells. Second memory plane 411 comprises a plurality of single ended memory cells. Each of the single ended memory cells is coupled to a write row-select line 443 and a read row-select line 429. Precharging circuitry 448 comprises a plurality of precharger circuits 501, 502, and 503 and is controlled by logic circuitry 430. Read column select circuit 416 comprises a plurality of multiplexers 511 and 512. Each multiplexer is coupled to a plurality of read bit lines. Read logic circuitry 430 is coupled to each of the multiplexers in read column select circuit 416 and selects which read bit line to couple to sense amplifier circuitry 421. In one embodiment of the present invention each multiplexer is coupled to eight read bit lines. Sense amplifier circuitry 421 comprises a plurality of sense amplifiers 521 and 522. In one embodiment of the present invention, each sense amplifier is coupled to a multiplexer in read column select circuit 416.

Upon receiving an address from read counter 450 indicating that a first word from first memory plane 410 is to be read on the next cycle, logic circuitry 430 sends a signal to precharger circuits 501, 502, and 503 turning precharger circuits 501, 502, and 503 on to precharge read bit lines 551, 552, and 553 in this alternate memory plane, 411.

Upon receiving an address from counter 450 indicating that a fourth word from first memory plane 410 is to be read, logic circuitry 430 turns precharger circuits 501, 502, and 503 off. Logic circuitry 430 sends a signal to read row decoder 427 instructing read row decoder 426 to assert the read row-select line corresponding to a row of cells in second memory plane 411 which will be read next (i.e., the 16th through 32nd words). This discharges read bit lines 551, 552, and 553 in accordance to the data stored in corresponding memory cells which will be read next.

Upon receiving an address from read counter 450 indicating that a sixteenth word in second memory plane 410 is to be read, logic circuitry 430 deasserts the read word line that was previously asserted in the first memory plane and instructs precharging circuitry 447 to begin precharging the read bit lines in first memory plane 410. Logic circuitry 430 instructs read column select circuit 416 to sequentially send data on the read bit lines corresponding to the seventeenth word to sense amplifier circuit 421.

Upon receiving an address from counter 450 indicating that a twentieth word in second memory plane 410 is to be read, logic circuitry 430 turns off the precharging circuitry 447 and instructs read row decoder 426 to assert a read row-select line corresponding to a row of cells in the first memory plane to be read next (i.e. the 33rd through 48th words). This discharges read bit lines corresponding to the memory cells to be read next in accordance to the data stored in the memory cells.

Upon receiving an address from counter 430 indicating that a thirty second word in first memory plane 411 is to be read, logic circuitry 430 deasserts the read word line that was previously asserted in the second memory plane and instructs precharging circuitry 448 to begin precharging the read bit lines in second memory plane 411. Logic circuitry 430 also instructs read column select circuit 415 to sequentially send data on the read bit lines corresponding to the thirty third word to sense amplifier circuit 420.

In one embodiment of the present invention, write column select circuit 435 writes directly to the read bit lines in first memory plane 410 when there is not sufficient time to pre-fetch data stored in memory cells in first memory plane 410, and write column select 436 writes directly to the read bit lines in second memory plane 411 when there is not sufficient time to pre-fetch data stored in memory cells in second memory plane 411.

Figure 6:
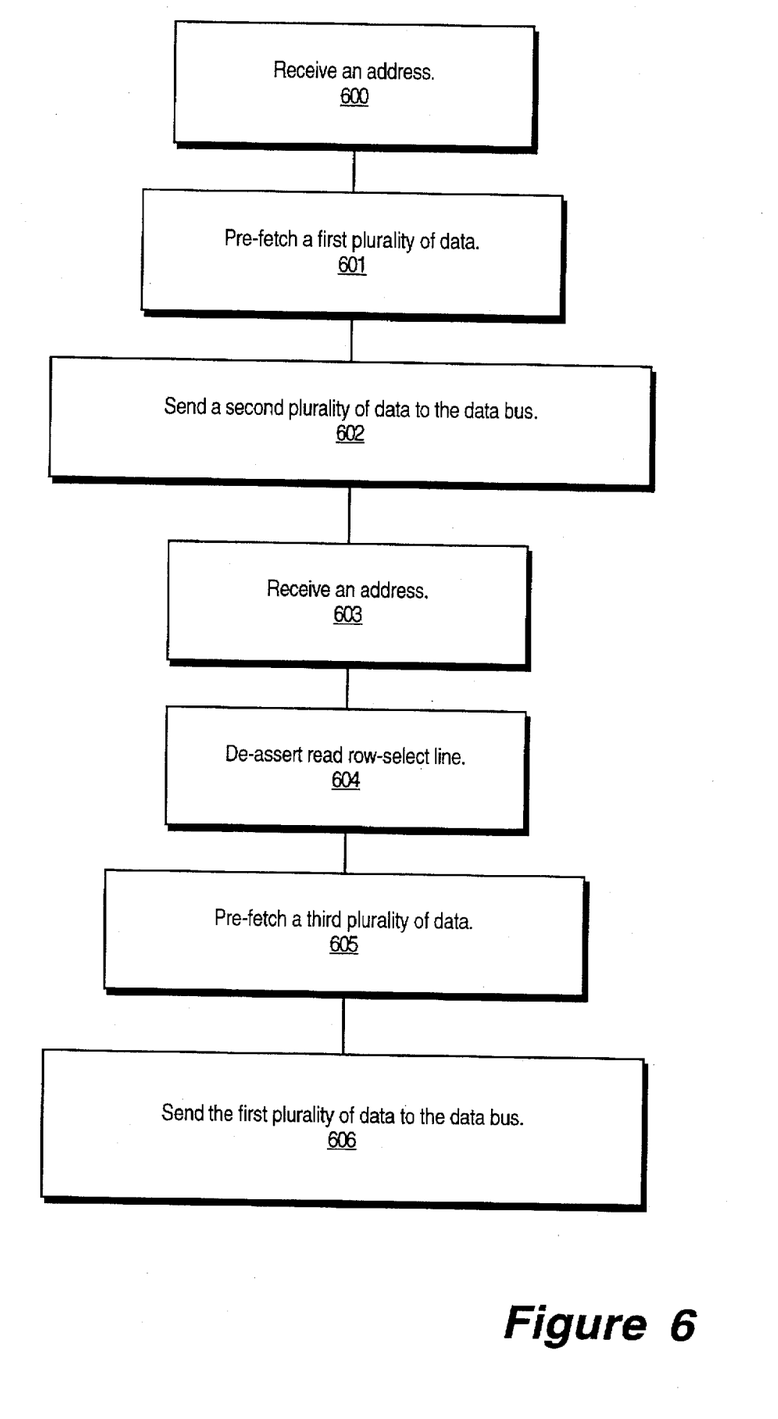
FIG. 6 illustrates a flow chart of a method of accessing data from a memory.

FIG. 6 is a flow chart illustrating a method for accessing data in a first in first out memory having a second memory plane and a second memory plane. At step 600, receive an address of a memory cell which is to be read. The memory cell resides in the second memory plane.

At step 601, pre-fetch a first plurality of data from the first memory plane. The first plurality of data resides in memory cells in the first memory plane that will be read next. Pre-fetching is achieved by precharging read bit lines in the first memory plane and then asserting a read row-select line corresponding to the memory cells in the first memory plane that will be read next. Assertion of the read row-select line is performed a predetermined number of clock cycles after precharging the read bit lines. Asserting the read row-select line results in discharging the read bit lines according to data stored in the memory cells.

At step 602, send a second plurality of data from the second memory plane to a data bus. The sending is performed at a time the first plurality of data from the first memory plane is pre-fetched. The second plurality of data resides at the address in the second memory plane which was received. Sending is achieved by sending voltage states of discharged (or still charged, depending on the data in the memory cells) bit lines in the second memory plane to a sense amplifier and sending sense amplifier outputs to the data bus.

At step 603, receive an address of a memory cell which is to be read. The memory cell resides in the first memory plane.

At step 604, de-assert the read row-select line that was previously asserted in the second memory plane.

At step 605, pre-fetch a third plurality of data from the second memory plane. The third plurality of data is data in memory cells in the second memory plane that will be read next. Pre-fetching is achieved by precharging read bit lines in the second memory plane and then asserting a read row-select line corresponding to the memory cells in the second memory plane that will be read next after a predetermined number of clock cycles. This results in discharging the read bit lines according to data stored in the memory cells.

At step 606, send the first plurality of data from the first memory plane to the data bus. The sending is performed at a time the third plurality of data from the second memory plane is being pre-fetched. The first plurality of data resides in the address in the first memory plane which was received. Sending is achieved by sending voltage states of discharged read bit lines (according to data stored in the memory cells) in the first memory plane to a sense amplifier and sending sense amplifier outputs to the data bus.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of accessing data in a memory having a first memory plane and a second memory plane, comprising the steps of:
   (A) pre-fetching a first plurality of data from the first memory plane up to a selectable plurality of clock cycles before the first plurality of data is sent to a data port; and
   (B) sending a second plurality of data from the second memory plane to the data port only during a time the first plurality of data from the first memory plane is pre-fetched.

2. The method of claim 1, wherein the step (A) further comprises the steps of:
   (i) precharging bit lines in the first memory plane; and
   (ii) discharging the bit lines in the first memory plane after a predetermined number of clock cycles.

3. The method of claim 1, wherein the step (B) further comprises the steps of:
   (i) sending voltage states of bit lines in the second memory plane to a sense amplifier; and
   (ii) sending sense amplifier outputs to a data port.

4. The method of claim 1, wherein the selectable plurality of clock cycles is selectable up to sixteen clock cycles before the first plurality of data is sent to the data port.

5. The method of claim 1, further comprising the step of:
   (C) pre-fetching a third plurality of data from the second memory plane; and
   (D) sending the first plurality of data from the first memory plane to the data port while pre-fetching the third plurality of data from the second memory plane.

6. The method of claim 1, wherein the first memory plane and the second memory plane comprise an array of single ended memory cells.

7. The method of claim 1, wherein the first memory plane and the second memory plane comprise an array of differential memory cells.

8. The method of claim 4, wherein the selectable plurality of clock cycles is sixteen clock cycles.

9. The method of claim 2, wherein the predetermined number of clock cycles is four clock cycles.

10. A method of accessing data in a memory having a first memory plane and a second memory plane, comprising the steps of:
    (A) prefetching a first plurality of data from the first memory plane at least several clock cycles selectable up to sixteen clock cycles before sending the first plurality of data to a data port; and
    (B) sending a second plurality of data from the second memory plane to the data port during a time the first plurality of data is pre-fetched from the first memory plane.

11. The method of claim 10, wherein the several clock cycles is selected to be a number greater than 4.

12. The method of claim 10, wherein the several clock cycles is selected to be 16 cycles.

13. The method of claim 10, wherein the step (A) further comprises the steps of:

(i) precharging the bit lines in the first memory plane; and (ii) discharging the bit lines in the first memory plane after a predetermined number of clock cycles.

14. The method of claim 10, wherein step (B) further comprises the steps of:

(i) sending voltage states of bit lines in the second memory plane to a sense amplifier; and (ii) sending sense amplifier outputs to the data port.

15. An integrated circuit memory, comprising:

(A) a data port;

(B) a first memory plane coupled to the data port;

(C) a second memory plane coupled to the data port;

(D) a pre-fetching circuit coupled to the first memory plane, the pre-fetching circuit pre-fetching a first plurality of data from the first memory plane up to a selectable plurality of clock cycles before the first plurality of data is sent to the data port; and (E) a data retrieving circuit coupled to the second memory plane, the data retrieving circuit sending a second plurality of data from the second memory plane to the data port only while the pre-fetching circuit is pre-fetching the first plurality of data.

16. The memory of claim 15, wherein the pre-fetching circuit comprises a read row decoder circuit.

17. The memory of claim 15, wherein the data retrieving circuit comprises a read column select circuit.

18. The memory of claim 15, wherein the first memory plane and the second memory plane comprise a plurality of dual ported single ended memory cells.

19. The memory of claim 15, wherein the first memory plane and the second memory plane comprises a plurality of dual ported differential memory cells.

20. The memory of claim 15, wherein the first memory plane, the second memory plane, the data port, the pre-fetching circuit, and the retrieving circuit all reside on a same semiconductor substrate, and wherein the data port is for coupling data to an external data bus.

21. An apparatus for accessing data from a memory having a first memory plane and a second memory plane, comprising:

(A) a counter generating an address of a memory cell to be accessed, the address being in either the first memory plane or the second memory plane;

(B) logic circuitry coupled to the counter, the logic circuitry outputting a first signal when the address of the memory cell is in the first memory plane and outputting a second signal when the address of the memory cell is in the second memory plane; and (C) pre-fetching circuitry coupled to the logic circuitry, the pre-fetching circuitry pre-fetching data from the second memory plane (i) when receiving the first signal and (ii) up to a selectable plurality of clock cycles before the data is sent to a data port and pre-fetching data from the first memory plane (iii) when receiving the second signal and (iv) up to a selectable plurality of clock cycles before the data is sent to a data port.

22. The apparatus of claim 21, wherein the pre-fetching circuit comprises precharging circuitry and row decoding circuitry.

23. The apparatus of claim 21, wherein the first memory plane and the second memory plane comprise a plurality of dual ported single ended memory cells.

24. The apparatus of claim 21, wherein the first memory plane and the second memory plane comprises a plurality of dual ported differential memory cells.

25. The apparatus of claim 21, wherein the first memory plane, the second memory plane, the counter, the logic circuitry, and the pre-fetching circuitry all reside on a same semiconductor substrate.

* * * * *